(12) United States Patent
Hwu et al.

(10) Patent No.: US 9,228,115 B2
(45) Date of Patent: Jan. 5, 2016

(54) METHOD OF FABRICATING FLEXIBLE SUBSTRATE STRUCTURE

(71) Applicant: AU Optronics Corp., Hsin-Chu (TW)

(72) Inventors: Keh-Long Hwu, Hsin-Chu (TW);
Pin-Fan Wang, Hsin-Chu (TW);
Chih-Jen Hu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 239 days.

(21) Appl. No.: 14/080,819

(22) Filed: Nov. 15, 2013

(65) Prior Publication Data

US 2014/0072724 A1    Mar. 13, 2014

Related U.S. Application Data

(62) Division of application No. 13/172,835, filed on Jun. 30, 2011, now abandoned.

(30) Foreign Application Priority Data

Dec. 27, 2010   (TW) .............................. 099146069 A (51) Int. Cl.
*B32B 38/10*    (2006.01)
*C09J 5/00*     (2006.01)
*B32B 7/06*     (2006.01)
*B32B 7/12*     (2006.01)
*H01L 27/12*    (2006.01)

(52) U.S. Cl.
CPC ... *C09J 5/00* (2013.01); *B32B 7/06* (2013.01); *B32B 7/12* (2013.01); *B32B 2405/00* (2013.01); *H01L 27/1218* (2013.01); *Y10T 156/1195* (2015.01); *Y10T 428/2486* (2015.01)

(58) Field of Classification Search
CPC ................. C09J 5/00; B32B 7/06; B32B 7/12
See application file for complete search history.

(56) References Cited

U.S. PATENT DOCUMENTS

| 6,284,050 | B1 | 9/2001 | Shi |
| 6,425,971 | B1 * | 7/2002 | Silverbrook ........ B81C 1/00904 |
| | | | 156/153 |
| 7,566,950 | B2 | 7/2009 | Huang |
| 2003/0223138 | A1 | 12/2003 | Akiyama |
| 2006/0003256 | A1 | 1/2006 | Takahashi |
| 2006/0112543 | A1 | 6/2006 | Ishikawa |
| 2008/0099134 | A1 * | 5/2008 | Tadakuma .......... B32B 37/0076 |
| | | | 156/250 |
| 2010/0068483 | A1 | 3/2010 | Leu |
| 2010/0167031 | A1 | 7/2010 | Leu |

FOREIGN PATENT DOCUMENTS

| CN | 101833215 A | 9/2010 |
| JP | 200327017 | 1/2003 |
| JP | 2007251080 | 9/2007 |
| TW | 201011427 | 3/2010 |

* cited by examiner

Primary Examiner — Daniel McNally
(74) Attorney, Agent, or Firm — Winston Hou; Scott Margo (57) ABSTRACT

A method of fabricating a flexible substrate structure includes the following steps. A supporting carrier is provided, and a release layer is formed on the supporting carrier, where the release layer includes a photo-sensitive adhesive layer. A local modification process is performed to form a bonding region with adhesion property in modified parts of the release layer, and to form a release region without adhesion property in unmodified parts of the release layer. The local modification process includes performing a local exposure process with a light source to form the bonding region with adhesion property in illuminated parts of the release layer, and to form a release region without adhesion property in unilluminated parts of the release layer.

15 Claims, 10 Drawing Sheets

METHOD OF FABRICATING FLEXIBLE SUBSTRATE STRUCTURE

CROSS REFERENCE TO RELATED APPLICATIONS

This application is a divisional of application Ser. No. 13/172,835 filed Jun. 30, 2011, which is incorporated by reference herein in its entirety.

BACKGROUND OF THE INVENTION

1. Field of the Invention

The present invention relates to a flexible substrate structure and a method of fabricating the same, and more particularly, to a method of fabricating a flexible substrate structure including forming a bonding region with adhesion property and a release region without adhesion property on a release layer with a local modification process, and a flexible substrate structure thereof.

2. Description of the Prior Art

In modern display technologies, flexible display device is distinguished for its characteristics such as light weight, impact endurance, flexibility, wearability, portability, etc. Thus, the flexible display devices are regarded as a foresighted display technology. A conventional method of fabricating a flexible display device has encountered a bottleneck of fabricating thin film transistors (TFTs) on a flexible substrate, such as a plastic substrate.

In accordance with the conventional method of fabricating the TFTs on the flexible substrate, the flexible substrate is disposed on a supporting carrier (e.g. a glass carrier), and then the supporting carrier will be separated from the flexible substrate by performing a release process after the TFTs is accomplished. In a conventional release process, a vacuum evaporated polymer film is utilized as a release layer, and then the release layer and the flexible substrate are bonded together due to a good adhesion of the polymer film between the plastic substrate and the glass carrier. In other words, the release layer has to be patterned to form a release region with low adhesion ability, and a bonding region with high adhesion ability. However, the conventional method of directly forming the patterned release layer by performing a vacuum evaporation process causes a high fabrication cost. In addition, the shadow mask utilized in the vacuum evaporation process has to be in contact with the release layer. As a result, the release layer tends to adhere to the shadow mask, which may cause a peeling problem consequently. On the other hand, a method of indirectly forming the patterned release layer requires extra processes.

SUMMARY OF THE INVENTION

It is therefore one of the objectives of the present invention to provide a flexible substrate structure and a method of making the same to reduce the fabrication cost, and to promote yield rate and quality of the flexible substrate structure.

In accordance with a preferred embodiment of the present invention, the flexible substrate structure includes a supporting carrier, flexible substrate, and a release layer. The flexible substrate is disposed on the supporting carrier. The release layer is disposed between the supporting carrier and the flexible substrate, and in contact with the supporting carrier and the flexible substrate. The release layer includes a bonding region with adhesion property, the bonding region is for bonding the flexible substrate and the supporting carrier together, and a release region without adhesion property, the release region is for supporting the flexible substrate.

In accordance with another preferred embodiment of the present invention, a method of fabricating the flexible substrate structure is described as followed. A supporting carrier is provided, and a release layer is formed on the supporting carrier, where the release layer includes a photo-sensitive adhesive layer. A local modification process is performed to form a bonding region with adhesion property in modified parts of the release layer, and to form a release region without adhesion property in unmodified parts of the release layer. The local modification process includes performing a local exposure process with a light source to form the bonding region with adhesion property in illuminated parts of the release layer, and to form a release region without adhesion property in unilluminated parts of the release layer.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention for one skilled in the art, preferred embodiments will be detailed as follows. The preferred embodiments of the present invention are illustrated in the accompanying drawings with numbered elements to elaborate the contents and effects to be achieved.

Figure 1:
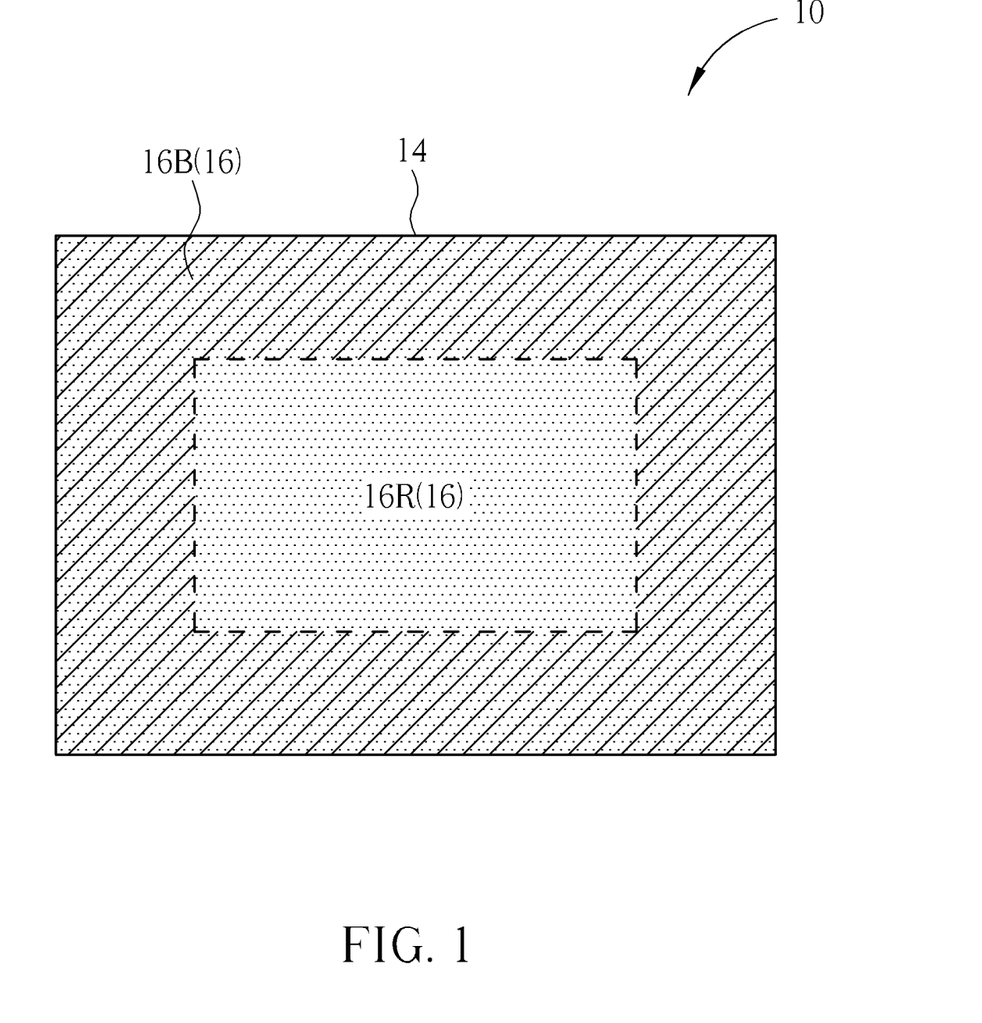
FIG. 1 and FIG. 2 are schematic diagrams illustrating a flexible substrate structure according to a preferred embodiment of the present invention.
Figure 2:
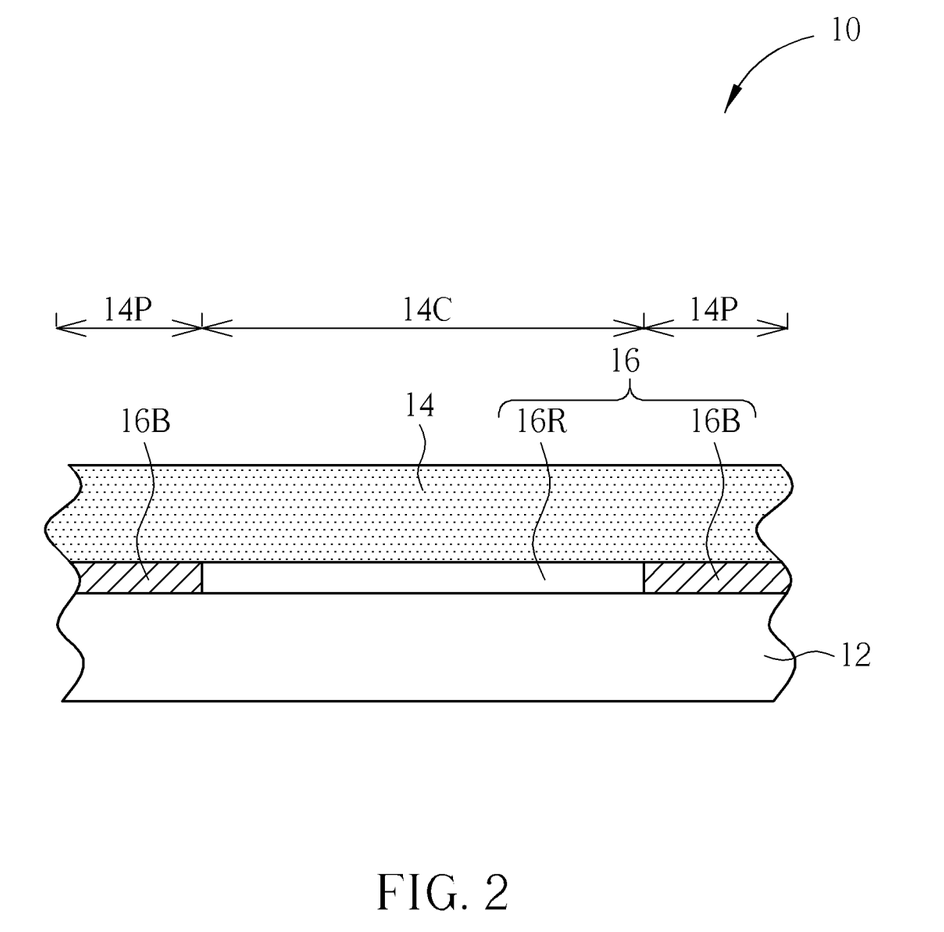

Please refer to FIG. 1 and FIG. 2, which schematically illustrate a flexible substrate structure according to a preferred embodiment of the present invention. FIG. 1 illustrates a top view of the flexible substrate, and FIG. 2 illustrates a cross-sectional view of the flexible substrate structure. To distinguish features of the flexible substrate structure of the present invention, some components are not shown in FIG. 1. As shown in FIG. 1 and FIG. 2, the flexible substrate structure 10 according to this embodiment includes a supporting carrier 12, a flexible substrate 14, and a release layer 16. Compared to the flexible substrate 14, the supporting carrier 12 is a hard substrate, such as a glass carrier, a semiconductor carrier or a metal carrier, but not limited thereto. The flexible substrate 14 is disposed on the supporting carrier 12, and the flexible substrate 14 is a soft substrate with flexibility. A material of the flexible substrate 14 may include polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN) or polyetherimide (PEI), but not limited thereto.

The flexible substrate 14 also can be made of other kinds of organic materials, inorganic materials or organic/inorganic hybrid materials.

The release layer 16 is disposed between the supporting carrier 12 and the flexible substrate 14, and in contact with the supporting carrier 12 and the flexible substrate 14 respectively. A material of the release layer 16 may include parylene or cyclic olefin copolymers (COC), but not limited thereto. In this embodiment, the release layer 16 completely covers the flexible substrate 14, and thus the flexible substrate 14 is not in contact with the supporting carrier 12. Moreover, the flexible substrate 14 has TFT arrays (not shown) and a display medium layer (not shown) disposed thereon. The display medium layer can be a liquid crystal layer, an organic light-emitting layer, an electro-chromic layer, an electric ink layer or a cholesteric liquid crystal, etc., but not limited thereto. The release layer 16 includes a bonding region 16B with adhesion property, and a release region 16R substantially without adhesion property. The bonding region 16B of the release layer 16 is used for bonding the flexible substrate 14 and the supporting carrier 12 together, and the release region 16R of the release layer 16 is used for supporting the flexible substrate 14. According to this embodiment, the flexible substrate 14 includes a central region 14C and a peripheral region 14P surrounding the central region 14C. The bonding region 16B with adhesion property of the release layer 16 corresponds to the peripheral region 14P of the flexible substrate 14, and the release region 16R without adhesion property of the release layer 16 corresponds to the central region 14C of the flexible substrate 14.

Accordingly, in this embodiment, the release layer 16 is an intact layer completely covering the flexible substrate 14, instead of a patterned layer. Therefore, a step of patternization can be omitted to save the fabrication cost, and also to promote yield rate and quality of the release layer 16. Moreover, the bonding region 16B of the release layer 16 is able to bond the flexible substrate to the supporting carrier 12 efficiently, so that display components, such as the TFT arrays, the display medium layer, etc., can be fabricated on the flexible substrate 14 by utilizing existing equipment. After the fabrication processes of the display components, such as the TFT arrays, the display medium layer, etc., are accomplished, a cutting process will be performed to cut the flexible substrate 14 at positions corresponding to edges around the release region 16R of the release layer 16, such as the edges within the release region 16R near the bonding region 16B. Thus, the flexible substrate 14 can be easily separated from the release layer 16 and the supporting carrier 12. It is noted that the cutting positions are not limited thereto. In the present invention, any other positions within the release region 16R can be cut according to designer's discretion. Additionally, the release layer 16 within the release region 16R remains on the supporting carrier 12 after the flexible substrate 14 is separated from the release layer 16.

Figure 3:
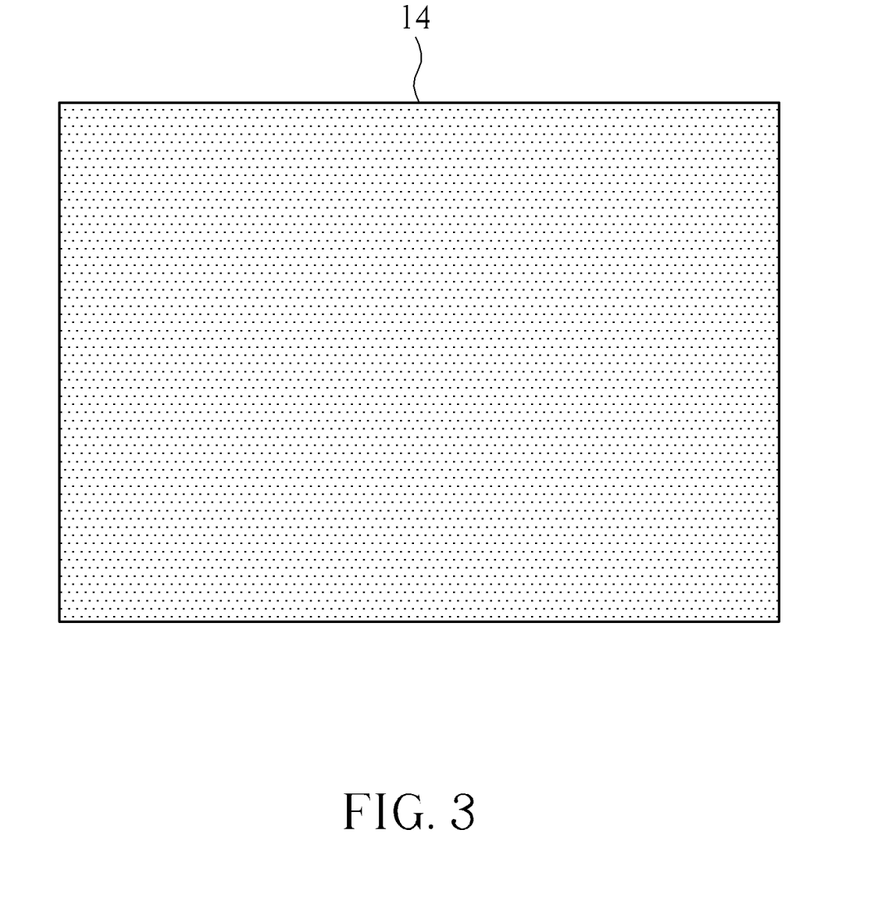
FIG. 3 through FIG. 7 are schematic diagrams illustrating a method of fabricating the flexible substrate structure according to a preferred embodiment of the present invention.
Figure 4:
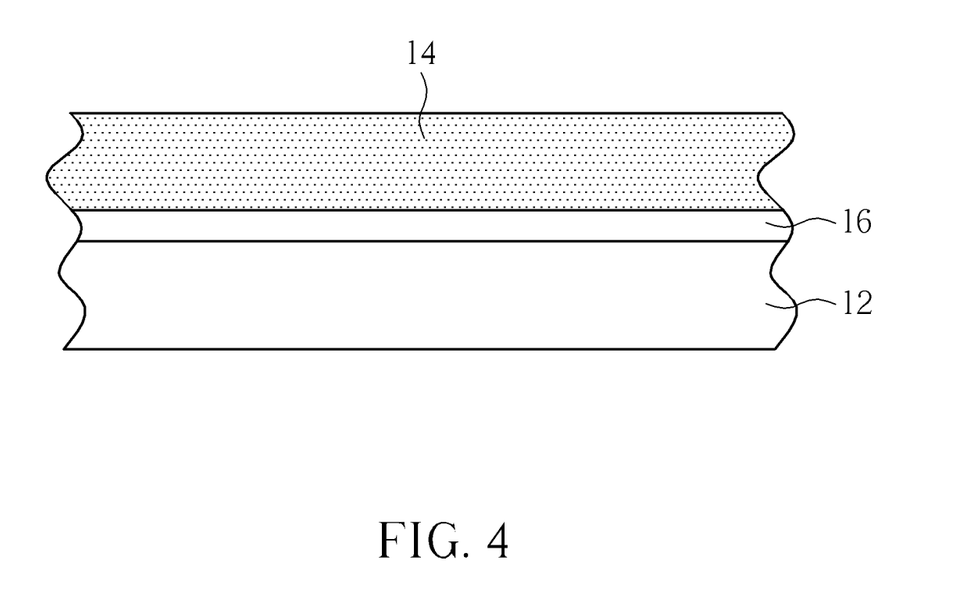
Figure 5:
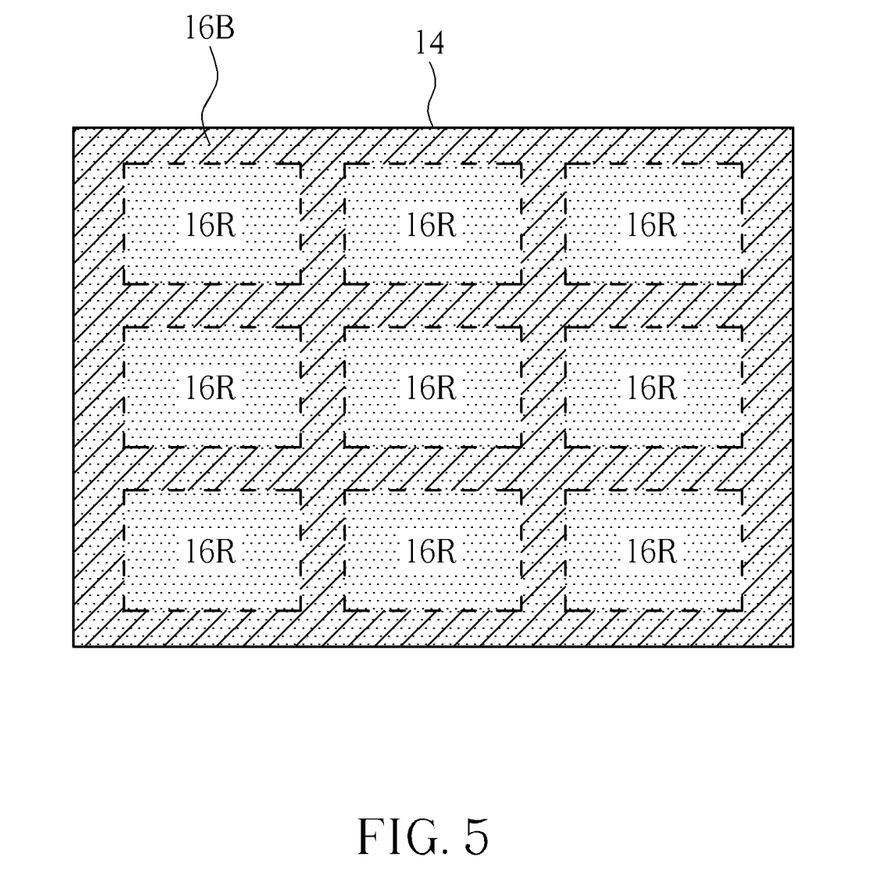
Figure 6:
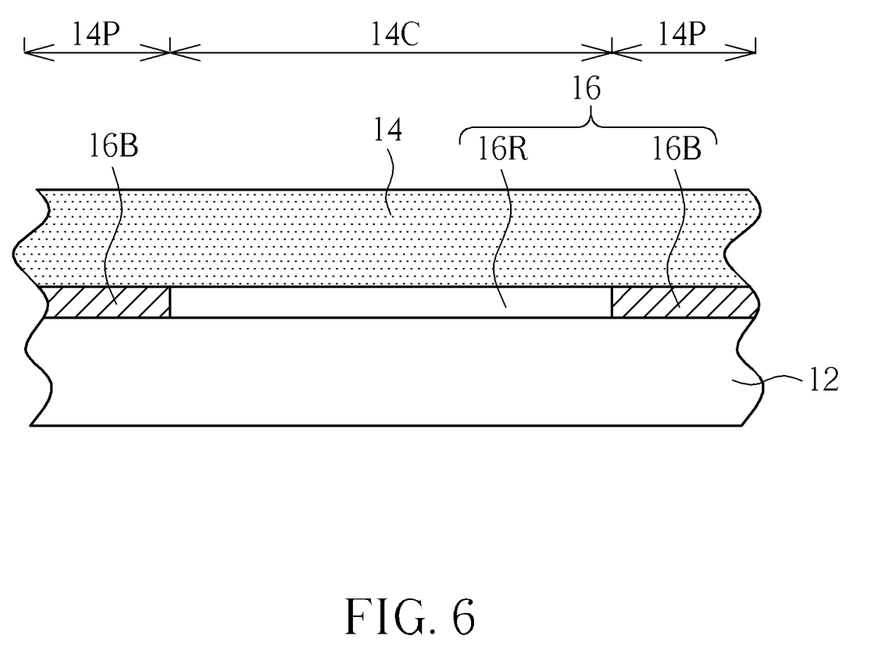
Figure 7:
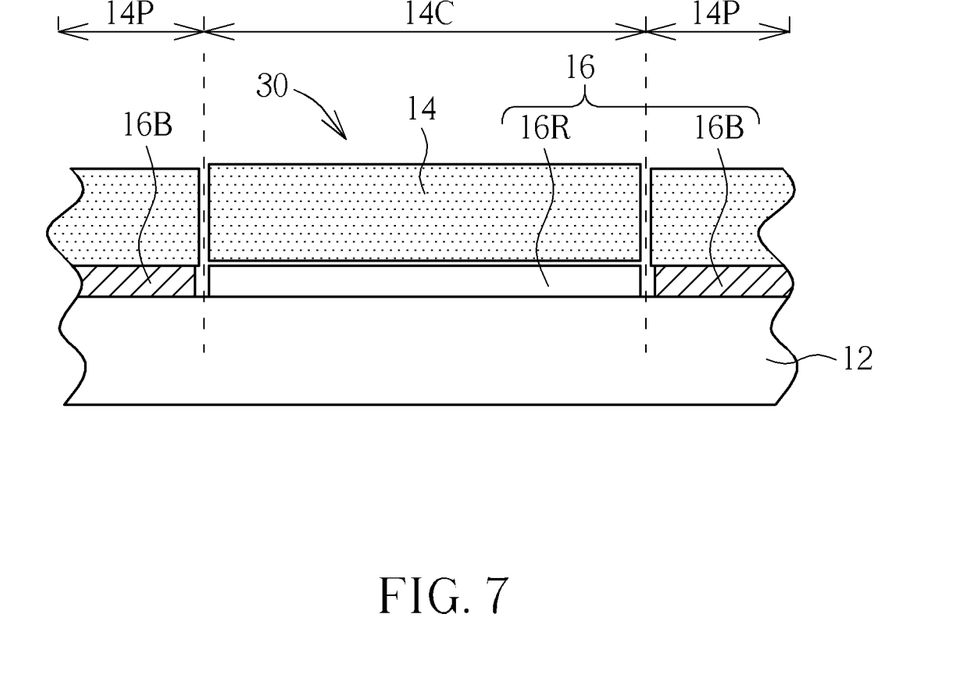

Please refer to FIG. 3 through FIG. 7, which schematically illustrate a method of fabricating the flexible substrate structure according to a preferred embodiment of the present invention. FIG. 3 and FIG. 5 illustrate top views of the flexible substrate structure, and FIG. 4, FIG. 6, and FIG. 7 illustrate cross-sectional views of the flexible substrate structure. According to this embodiment, the flexible substrate structure is fabricated in a batch process, so that a plurality of flexible substrate structures can be fabricated at the same time. As shown in FIG. 3 and FIG. 4, the supporting carrier 12 and the flexible substrate 14 are provided. The supporting carrier 12 is a hard substrate, and the flexible substrate 14 is a soft substrate. The materials and properties of the supporting carrier 12 and the flexible substrate 14 have been mentioned previously, and thus not redundantly described. Then, the flexible substrate 14 is disposed on the supporting carrier 12, and the release layer 16 is formed between the supporting carrier 12 and the flexible substrate 14. In this embodiment, the release layer 16 is formed on the supporting carrier 12 in advance, and then the flexible substrate 14 is disposed on the release layer 16. Thus, the release layer 16 can be formed between the supporting carrier 12 and the flexible substrate 14, and the release layer 16 is able to be in contact with the supporting carrier 12 and the flexible substrate 14 respectively. The material of the release layer 16 may include parylene or cyclic olefin copolymers (COC), but not limited thereto. In this embodiment, the release layer 16 can be formed on the supporting carrier 12 by performing an evaporation process, but not limited thereto. The release layer 16 also can be fabricated by other appropriate methods.

As shown in FIG. 5 and FIG. 6, after the flexible substrate 14 is formed on the release layer 16, a local modification process is performed on the release layer 16 so as to form the bonding region 16B with adhesion property in modified parts of the release layer 16 for bonding the flexible substrate 14 and the supporting carrier 12 respectively, and to form the release region 16R without adhesion property in unmodified parts of release layer 16 for supporting the flexible substrate 14. A power substantially between 76 Kcal/mol and 140 Kcal/mol is required in the local modification process, but not limited thereto. The local modification process is able to change properties of the release layer 16, for example, the local modification process may break the molecular bonding of the release layer 16. In addition, the local modification process can be implemented with an exposure process and/or a heating process. In accordance with a first preferred manufacturing method of the present invention, the release layer 16 can be a photo-sensitive adhesive layer, and the photo-sensitive adhesive layer can be modified after exposed by a specific light source so as to obtain adhesion property. Therefore, in the first preferred manufacturing method, the local modification process includes a local exposure process with the specific light source for forming the bonding region 16B with adhesion property in illuminated parts of the release layer 16, and forming the release region 16R without adhesion property in unilluminated parts of release layer 16. Moreover, as different materials or ingredients are selected for the release layer 16, different light sources, such as ultraviolet light sources or laser light sources, can be chosen for the local exposure process, but not limited thereto. Additionally, a dot light source or a linear light source may be utilized for the local exposure process, and the local exposure process is performed by light source scanning, but not limited thereto. For instance, the local exposure process also can be performed by using a surface light source with a patterned mask (not shown) to expose specific parts of the release layer 16. The patterned mask needs not to be in contact with the release layer 16, and thus would not cause damage to the release layer 16. According to the first preferred manufacturing method, a preferred exposure time of the local exposure process is substantially between 40 seconds and 120 seconds, but not limited thereto. Furthermore, when the ultraviolet light source is chosen for the local exposure process, a wavelength of the ultraviolet light source is substantially between 1 nanometer and 400 nanometers, and a preferable wavelength is substantially smaller than 300 nanometers, but not limited thereto. Please refer to Table. 1, which shows a relation between exposure time and peeling force on condition that the ultraviolet light source with the wavelength substantially smaller than 300 nanometers is utilized for in local exposure process.

As shown in Table. 1, the peeling force of the release layer 16 tends to increase with an increase of the exposure time within 100 seconds. When the exposure time lasts for more than about 100 seconds, the peeling force would no longer increase.

TABLE 1

| | exposure time (seconds) | | | | |
| --- | --- | --- | --- | --- | --- |
| | 40 | 60 | 80 | 100 | 120 |
| peeling force (gf) | 18.5 | 25 | 43.5 | 53 | 53 |

Additionally, according to a second preferred manufacturing method of the present invention, the release layer 16 can be a heat-sensitive adhesive layer, and the heat-sensitive adhesive layer can be modified after being heated so as to obtain adhesion property. Therefore, in the second preferred manufacturing method, the local modification process includes a local heating process for forming the bonding region 16B with adhesion property in heated parts of the release layer 16, and forming the release region 16R without adhesion property in unheated parts of release layer 16. Moreover, the flexible substrate 14 includes a central region 14C and a peripheral region 14P surrounding the central region 14C. The bonding region 16B of the release layer 16 corresponds to the peripheral region 14P of the flexible substrate 14, and the release region 16R of the release layer 16 corresponds to the central region 14C of the flexible substrate 14. In the second preferred manufacturing method, the local heating process is favorably preformed under an aerobic environment, and a preferred process temperature is substantially larger than 200° C. Please refer to Table. 2, which shows a relation between process temperature and peeling force on condition that the release layer 16 is made of parylene, and a heating time is about 10 minutes. As shown in Table. 2, when the process temperature is about 250° C., the peeling force of the release layer 16 can reach to about 950 gf. Also, the peeling force of the release layer 16 tends to decrease with an increase of the process temperature, but the release layer 16 is still able to provide sufficient adhesion ability.

TABLE 2

| | process temperature (° C.) | | | |
| --- | --- | --- | --- | --- |
| | 250 | 280 | 300 | 330 |
| peeling force (gf) | 950 | 200 | 150 | 150 |

As shown in FIG. 7, the flexible substrate 14 is fixed on the supporting carrier 12 by the bonding region 16B of the release layer 16, so that the display components, such as the TFT array, display medium layer, etc., can be fabricated on the flexible substrate 14 by utilizing existing equipment. After that, a cutting process is performed to cut the flexible substrate 14 at positions corresponding to edges around the release region 16R of the release layer 16, such as positions marked by dash lines in FIG. 7. Thus, the central region 14C of the flexible substrate 14 can be easily separated from the release layer 16 and the supporting carrier 12 so as to accomplish the flexible substrate structure of the present invention. It is noted that the cutting positions are not limited thereto, but also can be any positions within the release region 16R according to requirements. In addition, the release layer 16 within the release region 16R remains on the supporting carrier 12 after the central region 14C of the flexible substrate 14 is separated from the release layer 16.

Figure 8:
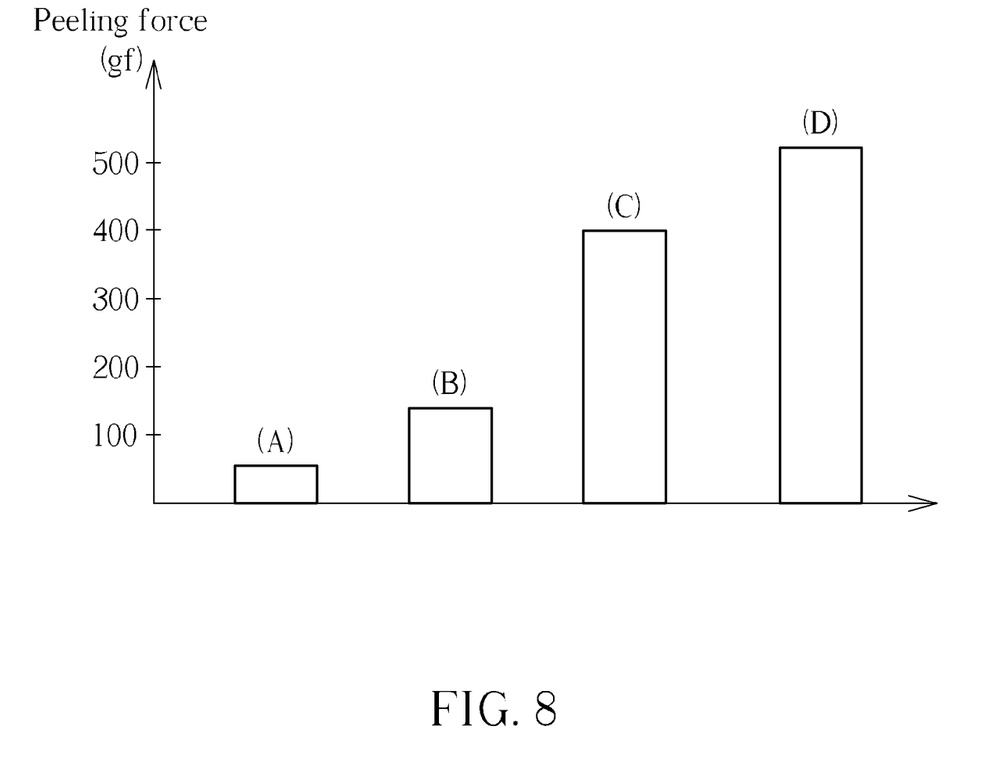
FIG. 8 is a bar diagram illustrating the corresponding peeling forces of the release layer in different types of local modification processes.

It is appreciated that the local modification processes according to other preferred manufacturing methods of the present invention may also include both the exposure process and the heating process. Please refer to FIG. 8. FIG. 8 is a bar diagram illustrating the corresponding peeling forces of the release layer in different types of local modification processes. In FIG. 8, sample A is an unmodified release layer; sample B is a release layer modified by performing the local exposure process; sample C is a release layer modified by performing both the local exposure process and the local heating process; and sample D is a release layer modified by performing the local heating process. As shown in FIG. 8, the peeling forces of samples B through D modified by performing the local modification processes are substantially larger than the peeling force of the unmodified sample A.

Figure 9:
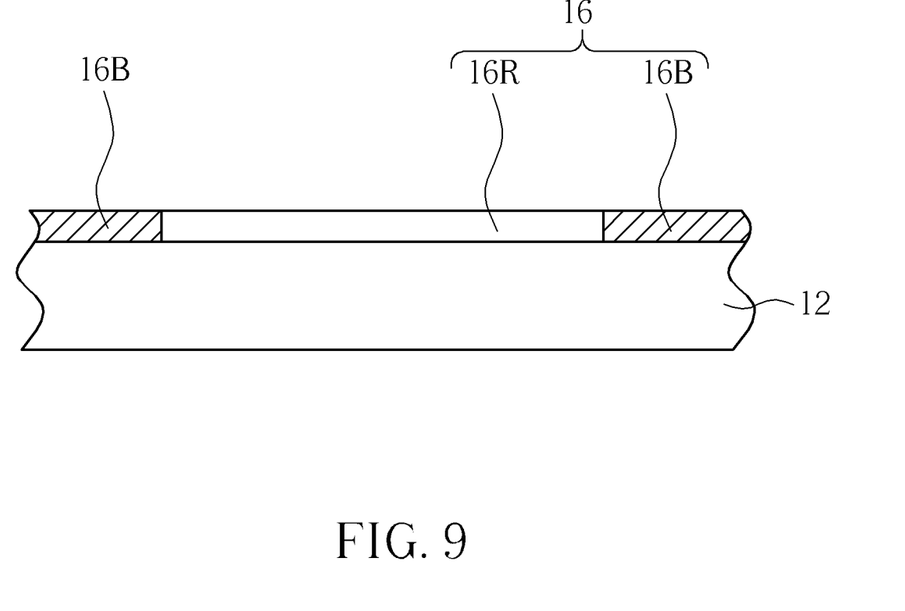
FIG. 9 and FIG. 10 are schematic diagrams illustrating a method of fabricating the flexible substrate structure according to another preferred embodiment of the present invention.
Figure 10:
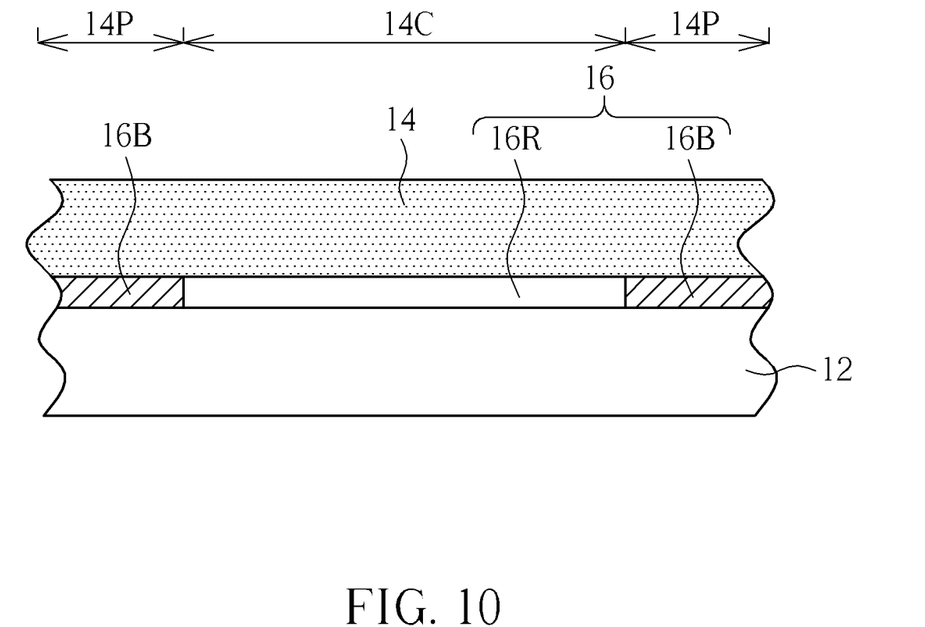

Please refer to FIG. 9 and FIG. 10, which schematically illustrate a method of fabricating the flexible substrate structure according to another preferred embodiment of the present invention. For the sake of clear comparison between different embodiments, identical components are denoted by identical numerals, in addition, the description focuses on the differences between embodiments, and repeated aspects are not redundantly described. As compared to the aforementioned embodiment, the local modification process in this preferred embodiment is performed on the release layer 16 before the flexible substrate is formed. Therefore, as shown in FIG. 9, the bonding region 16B with adhesion property in modified parts of the release layer 16 and the release region 16R without adhesion property in unmodified parts of the release layer 16 are formed. Also, the local modification process may include the exposure process, the heating process or the exposure process plus the heating process. As shown in FIG. 10, the flexible substrate 14 is formed on the release layer 16 subsequently. The flexible substrate 14 and the supporting carrier 12 are respectively bonded to the bonding region 16B of the release layer 16, and the release region 16R of the release layer 16 is able to support the flexible substrate 14. Then, the cutting process as shown in FIG. 7 may be performed, so that the central region 14C of the flexible substrate 14 can be separated from the release layer 16. Thus, the flexible substrate structure according to this embodiment is accomplished. Additionally, the release layer 16 within the release region 16R remains on the supporting carrier 12 after the central region 14C of the flexible substrate 14 is separated from the release layer 16.

To sum up, the flexible substrate structure and the method of fabricating the same of the present invention utilizes the local modification process to form the bonding region with adhesion property and to form the release region without adhesion property. As a result, the release layer can be intact without being patterned, the fabrication costs can be reduced and the yield rate and quality can be promoted. Moreover, the exposure process and/or the heating process can be chosen for the local modification process according to the material of the release layer or a required intensity of the peeling force.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a flexible substrate structure, comprising:
   providing a supporting carrier;
   forming a release layer on the supporting carrier, wherein the release layer comprises a photo-sensitive adhesive layer; and
   performing a local modification process to form a bonding region with adhesion property in modified parts of the release layer, and to form a release region without adhesion property in unmodified parts of the release layer, wherein the local modification process comprises performing a local exposure process with a light source to form the bonding region with adhesion property in illuminated parts of the release layer, and to form the release region without adhesion property in unilluminated parts of the release layer.

2. The method of fabricating the flexible substrate structure according to claim 1, further comprising forming a flexible substrate on the release layer, wherein the release layer is in contact with the supporting carrier and the flexible substrate respectively, and the supporting carrier and the flexible substrate are bonded together by the bonding region of the release layer.

3. The method of fabricating the flexible substrate structure according to claim 2, wherein the flexible substrate comprises a central region and a peripheral region surrounding the central region, wherein the bonding region with adhesion property of the release layer corresponds to the peripheral region of the flexible substrate, and the release region without adhesion property of the release layer corresponds to the central region of the flexible substrate.

4. The method of fabricating the flexible substrate structure according to claim 3, further comprising cutting the flexible substrate at positions corresponding to edges around the release region of the release layer for separating the central region of the flexible substrate from the release layer and the supporting carrier.

5. The method of fabricating the flexible substrate structure according to claim 4, wherein the release layer within the release region remains on the supporting carrier after the central region of the flexible substrate is separated from the release layer.

6. The method of fabricating the flexible substrate structure according to claim 2, wherein the local modification process is performed before the flexible substrate is formed.

7. The method of fabricating the flexible substrate structure according to claim 2, wherein the local modification process is performed after the flexible substrate is formed.

8. The method of fabricating the flexible substrate structure according to claim 2, wherein the release layer completely covers the flexible substrate.

9. The method of fabricating the flexible substrate structure according to claim 2, wherein a material of the flexible substrate includes polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN) or polyetherimide (PEI).

10. The method of fabricating the flexible substrate structure according to claim 1, wherein the light source includes an ultraviolet light source.

11. The method of fabricating the flexible substrate structure according to claim 10, wherein a wavelength of the ultraviolet light source is substantially between 1 nanometer and 400 nanometers.

12. The method of fabricating the flexible substrate structure according to claim 1, wherein an exposure time of the local modification process is substantially between 40 seconds and 120 seconds.

13. The method of fabricating the flexible substrate structure according to claim 1, wherein the light source includes a laser light source.

14. The method of fabricating the flexible substrate structure according to claim 1, wherein a material of the release layer includes parylene or cyclic olefin copolymers (COC).

15. The method of fabricating the flexible substrate structure according to claim 1, wherein the supporting carrier comprises a glass carrier, a semiconductor carrier or a metal carrier.

* * * * *